United States Patent
Yin et al.

(10) Patent No.: US 9,893,693 B2
(45) Date of Patent: Feb. 13, 2018

(54) GAIN CONTROL METHOD FOR A BROADBAND INDUCTORLESS LOW NOISE AMPLIFIER

(71) Applicant: Futurewei Technologies, Inc., Plano, TX (US)

(72) Inventors: Ping Yin, Greensboro, NC (US); Robert Grant Irvine, Greensboro, NC (US); Chengfang Liao, Shanghai (CN); Zhihang Zhang, Cary, NC (US)

(73) Assignee: Futurewei Technologies, Inc., Plano, TX (US)

( * ) Notice: Subject to any disclaimer, the term of this patent is extended or adjusted under 35 U.S.C. 154(b) by 639 days.

(21) Appl. No.: 13/707,739

(22) Filed: Dec. 7, 2012

(65) Prior Publication Data

US 2014/0162732 A1  Jun. 12, 2014

(51) Int. Cl.
| | |
|---|---|
| *H03G 3/00* | (2006.01) |
| *H03F 1/22* | (2006.01) |
| *H03F 3/193* | (2006.01) |
| *H03G 3/30* | (2006.01) |

(Continued)

(52) U.S. Cl.
CPC .............. *H03G 3/00* (2013.01); *H03F 1/22* (2013.01); *H03F 3/193* (2013.01); *H03G 3/3036* (2013.01); *H04B 1/3827* (2013.01); *H04B 1/18* (2013.01)

(58) Field of Classification Search
CPC ......... H01L 2924/1301; H01L 2924/00; H01L 2224/92144; H01L 22/20; H01L 23/34; H01L 2924/014; H04W 52/0209

USPC .................. 455/571; 330/284, 278; 370/261; 327/308; 324/158.1
See application file for complete search history.

(56) References Cited

U.S. PATENT DOCUMENTS 5,331,290 A * 7/1994 Harford ............... H03G 1/0023
                                                        330/254
5,994,961 A  11/1999 Lunn et al.
(Continued)

FOREIGN PATENT DOCUMENTS

| CN | 1675832 A | 9/2005 |
| CN | 1736022 A | 2/2006 |
| CN | 102427339 A | 4/2012 |

OTHER PUBLICATIONS

Hampel, et al., "Inductorless 1-10.5 GHz Wideband LNA for Multistandard Applications," IEEE Asian Solid State Circuits Conference, Nov. 16-18, 2009, Taipei, Taiwan, pp. 269-272.
(Continued)

*Primary Examiner* — Walter Divito
*Assistant Examiner* — Natasha W Cosme
(74) *Attorney, Agent, or Firm* — Conley Rose, P.C.

(57) ABSTRACT

A mobile device comprising an antenna, a receiver coupled to the antenna, and a transmitter coupled to the antenna, wherein the receiver, the transmitter, or both comprise a low noise amplifier comprising an adjustable gain and a variable impedance controller, and wherein the low noise amplifier is configured to sink current and to adjust a shunt resistance substantially simultaneously. Included is a method comprising receiving an electrical signal, substantially simultaneously adjusting an input impedance and a gain factor, amplifying the electrical signal, thereby producing an amplified signal, and outputting the amplified signal.

19 Claims, 6 Drawing Sheets

(51) Int. Cl.
  *H04B 1/18* (2006.01)
  *H04B 1/3827* (2015.01)

(56) References Cited

U.S. PATENT DOCUMENTS

| | | | | |
|---|---|---|---|---|
| 6,100,761 | A * | 8/2000 | Ezell | H03F 3/4508 330/254 |
| 8,611,844 | B2 * | 12/2013 | Su | H04B 1/18 455/277.1 |
| 2005/0242881 | A1 * | 11/2005 | Redman-White et al. | 330/284 |
| 2006/0125565 | A1 * | 6/2006 | Schemmann et al. | 330/278 |
| 2007/0018709 | A1 * | 1/2007 | De Fazio et al. | 327/308 |
| 2007/0096720 | A1 * | 5/2007 | Clements et al. | 324/158.1 |
| 2010/0220637 | A1 * | 9/2010 | Chan | 370/277 |

OTHER PUBLICATIONS

Kaczman, et al, "A Single-Chip 10-Band WCDMA/HSDPA 4-Band GSM/EDGE SAW-less CMOS Receiver with DigRF 3G Interface and +90 dBm IIP2," IEEE Journal of Solid-State Circuits, vol. 44, No. 3, Mar. 2009, pp. 718-739.

Foreign Communication From a Counterpart Application, PCT Application No. PCT/CN2013/088698, International Search Report dated Mar. 13, 2014, 7 pages.

Foreign Communication From a Counterpart Application, PCT Application No. PCT/CN2013/088698, Written Opinion dated Mar. 13, 2014, 5 pages.

* cited by examiner

GAIN CONTROL METHOD FOR A BROADBAND INDUCTORLESS LOW NOISE AMPLIFIER

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A MICROFICHE APPENDIX

Not applicable.

BACKGROUND

One part in a radio transceiver is a radio frequency (RF) low noise amplifier (LNA), which may be used in either a receiver or a transmitter of the radio transceiver. The performance requirements for the RF LNA comprise low noise contribution, high gain amplification, and good linearity. For example, the RF LNA in a receiver will boost an electrical signal above a noise threshold of subsequent stages in the receiver while contributing very little noise to the electrical signal.

Impedance matching between the RF LNA and filters and/or other devices is needed in order to provide proper frequency response for the filters and/or other devices connected to the RF LNA. Conventional devices, systems, and methods may be insufficient to provide adjustable gain control while maintaining a substantially constant input impedance. As such, devices, systems, and methods for providing adjustable gain control while maintaining the input impedance are needed.

SUMMARY

In one embodiment, the disclosure includes a mobile device comprising an antenna, a receiver coupled to the antenna, and a transmitter coupled to the antenna, wherein the receiver, the transmitter, or both comprise a low noise amplifier comprising an adjustable gain and a variable impedance controller, and wherein the low noise amplifier is configured to sink current and to adjust a shunt resistance substantially simultaneously.

In another embodiment, the disclosure includes a method comprising receiving an electrical signal, substantially simultaneously adjusting an input impedance and a gain factor, amplifying the electrical signal, thereby producing an amplified signal, and outputting the amplified signal.

In yet another embodiment, the disclosure includes an amplifier comprising an input connection, an output connection, a variable impedance controller coupled to the input connection and the output connection, wherein the variable impedance controller is configured to have an adjustable impedance, a current source, a first transistor comprising a first interface coupled to the current source, a second interface coupled to the output connection, and a third interface coupled to the input connection and is configurable between a first state and a second state, wherein when the first transistor is in the first state, the first transistor prevents a route of electrical current via the first interface and the second interface of the first transistor, and wherein when the first transistor is in the second state, the first transistor allows a route of electrical current via the first interface and the second interface of the first transistor, a ground, and a second transistor comprising a first interface coupled to the current source, a second interface coupled to the ground, and a control interface and is configurable between a first state and a second state, wherein when the second transistor is in the first state, the second transistor prevents a route of electrical current via the first interface and the second interface of the second transistor, and wherein when the second transistor is in the second state, the second transistor allows a route of electrical current via the first interface and the second interface of the second transistor.

BRIEF DESCRIPTION OF THE DRAWINGS

For a more complete understanding of this disclosure, reference is now made to the following brief description, taken in connection with the accompanying drawings and detailed descriptions, wherein like reference numerals represent like parts.

DETAILED DESCRIPTION OF THE EMBODIMENTS

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Disclosed herein are embodiments of an adjustable low noise amplifier (ALNA), a mobile device comprising an ALNA, and methods using the same. In an embodiment, the ALNA may be employed to provide an adjustable gain while also substantially maintaining its input impedance, thereby maintaining the frequency response characteristics of other components (e.g., filters) connected to the ALNA (e.g., in a receiver, in a transmitter, and/or in a mobile device), as will be disclosed herein.

Figure 1:
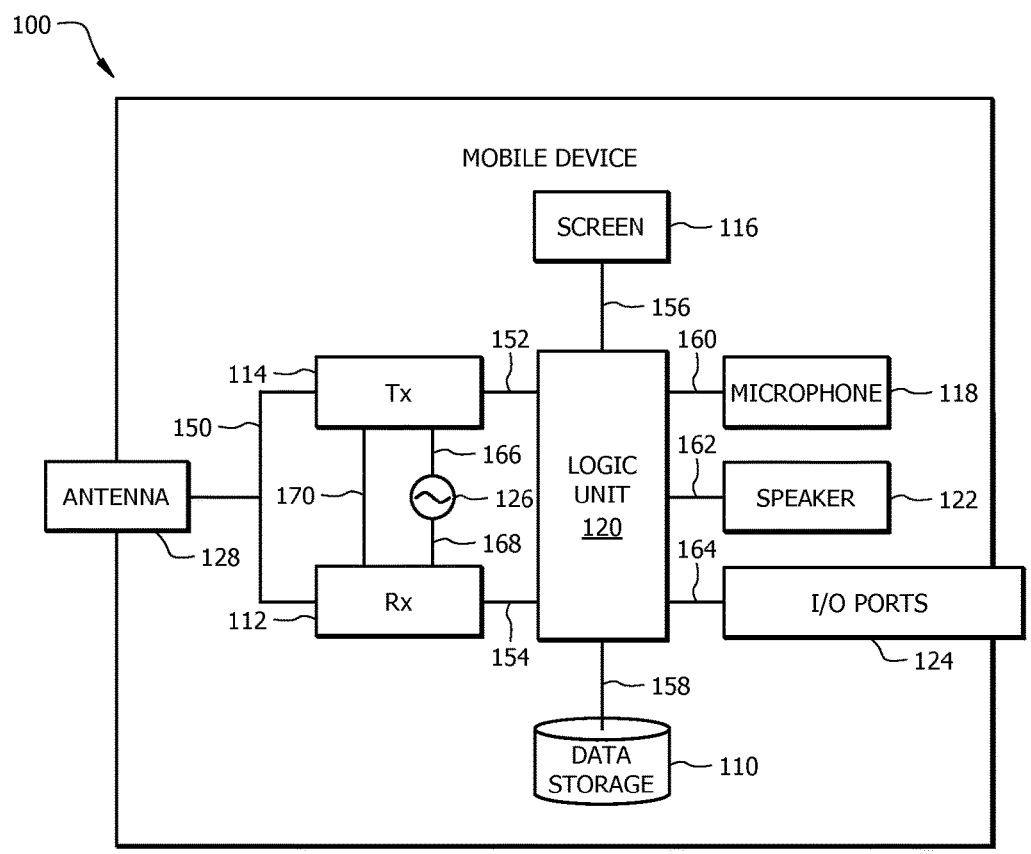
FIG. 1 is a schematic diagram of an embodiment of a mobile device.

Referring to FIG. 1, an embodiment of an operating environment of an ALNA is illustrated. In an embodiment, the operating environment generally comprises a plurality of functional units associated with a mobile device, as will be disclosed herein.

In an embodiment as illustrated in FIGS. 1-6, the mobile device 100 may comprise a plurality of functional units. In an embodiment, a functional unit (e.g., an integrated circuit (IC)) may perform a single function, for example, serving as an amplifier or a buffer. Additionally or alternatively, the functional unit may perform multiple functions on a single chip. In an embodiment, the functional unit may comprise a group of components (e.g., transistors, resistors, capacitors, diodes, and/or inductors) on an IC which may perform a defined function. In an embodiment, the functional unit may comprise a specific set of inputs, a specific set of outputs, and an interface (e.g., an electrical interface, a logical interface, and/or other interfaces) with other functional units of the IC and/or with external components. In some embodiments, the functional unit may comprise repeat instances of a single function (e.g., multiple flip-flops or adders on a single chip) or may comprise two or more different types of functional units which may together provide the functional unit with its overall functionality. For example, a microprocessor may comprise functional units such as an arithmetic logic unit (ALU), one or more floating point units (FPU), one or more load or store units, one or more branch prediction units, one or more memory controllers, and other such modules. In some embodiments, the functional unit may be further subdivided into component functional units. For example, a microprocessor as a whole may be viewed as a functional unit of an IC, for example, if the microprocessor shares circuit with at least one other functional unit (e.g., a cache memory unit).

The functional unit may comprise, for example, a general purpose processor, a mathematical processor, a state machine, a digital signal processor, a video processor, an audio processor, a logic unit, a logic element, a multiplexer, a demultiplexer, a switching unit, a switching element an input/output (I/O) element, a peripheral controller, a bus, a bus controller, a register, a combinatorial logic element, a storage unit, a programmable logic device, a memory unit, a neural network, a sensing circuit, a control circuit, a digital to analog converter, an oscillator, a memory, a filter, an amplifier, a mixer, a modulator, a demodulator, and/or any other suitable devices as would be appreciated by one of ordinary skill in the art.

In the embodiments of FIGS. 1-6, the mobile device 100 may comprise a plurality of distributed components and/or functional units and each functional unit may communicate with via a suitable signal conduit, for example, via one or more electrical connections, as will be disclosed herein.

In the embodiment of FIG. 1, the operating environment comprises mobile device 100 comprising a plurality of interconnected functional units, for example, for transmitting and/or receiving one or more wireless signals. In the embodiment of FIG. 1, the mobile device 100 may generally comprise various functional units including, but not limited to one or more antennas 128, a transmitter 114, a receiver 112, a local oscillator 126, a logical unit 120, a data storage device 110, a screen 116, a microphone 118, a speaker 122, a plurality of input and/or output (I/O) ports 124, arranged as shown in FIG. 1. In such an embodiment, the mobile device 100 is configured such that a wireless signal may be received, transmitted, and/or undergo signal processing by the mobile device 100. While FIG. 1 illustrates a particular embodiment of an operating environment in which an ALNA may be employed and/or a particular configuration of functional units with which an ALNA may be associated, one of ordinary skill in the art, upon viewing this disclosure, will appreciate that an ALNA as will be disclosed herein may be similarly employed in alternative operating environments and/or with alternative configurations of mobile device functional units.

In an embodiment, the mobile device 100 may comprise one or more antennas 128, which may be exterior to and/or interior to the mobile device 100. In an embodiment, the antennas 128 may be configured to interface and/or to couple to the transmitter 114, the receiver 112, and/or any other functional units of the mobile device 100, as will be disclosed herein. For example, in the embodiment of FIG. 1, the output of the antennas 128 may be electrically connected to an input of the transmitter 114 (e.g., via electrical connection 150) and/or to an input of the receiver 112 (e.g., via electrical connection 150).

In such an embodiment, the antennas 128 may be configured to receive and/or to transmit a wireless signal to/from the mobile device 100. In an embodiment, the antenna 128 may comprise a patch antenna, a microstrip antenna, a loop antenna, an omni directional antenna, a planar inverted-F antenna (PIFA), a folded inverted conformal antenna (FICA), a monopole antenna, any other suitable antenna as would be appreciated by one of ordinary skill in the art upon viewing this disclosure, or combinations thereof. Additionally, in an embodiment, the antennas 128 may be configured to be responsive to one or more predetermined frequency bands. For example, the antennas 128 may be configured to be responsive to a wireless signal (e.g., a RF signal) within a predetermined frequency band, for example, within the 700 Band, the 800 band, the 850 band, the 1400 band, the personal communication services (PCS) band, the advanced wireless services (AWS) band, the broadband radio services (BRS)/emergency broadcast system (EBS) band, long term evolution (LTE) band, any other suitable frequency band as would be appreciated by one of ordinary skill in the art upon viewing this disclosure, or combinations thereof. In an additional or alternative embodiment, the antennas 128 may be configured to be selectively tuned to be responsive to one or more frequency bands, for example, by an antenna switch, as will be disclosed herein.

In the embodiment of FIG. 1, the logic unit 120 may be electrically connected to the transmitter 114 (e.g., via electrical connection 152), the receiver 112 (e.g., via electrical connection 154), the screen 116 (e.g., via electrical connection 156), the microphone 118 (e.g., via electrical connection 160), the speaker 122 (e.g., via electrical connection 162), the data storage device 110 (e.g., via electrical connection 158), and the I/O ports 124 (e.g., via electrical connection 164).

In an embodiment, the logic unit 120 comprises an electronic circuit configured to perform arithmetic operations and/or logical operations. Additionally, the logic unit 120 may be configured to control the flow of data through the mobile device 100 and/or coordinate the activities of one or more functional units of the mobile device 100. For example, the logic unit 120 may be configured to be coupled with and/or to control data transmission between the transmitter 114, the receiver 112, the microphone, 118, the speaker 122, and/or any other functional units of the mobile device 100. In an additional or alternative embodiment, the logic unit 120 may further comprise a digital signal processor (DSP) and may be configured to manipulate, to modify, and/or to improve a digital electrical signal, for example, a digital electrical signal from the receiver 112.

In an embodiment, the data storage device 110 may be generally configured to store information (e.g., data) for the mobile device 100. In such an embodiment, the mobile device 100 may be configured to read and/or to write data to one or more memory cells of the data storage device 110. In an embodiment, the data storage device 110 may comprise a read only memory (ROM), a random access memory (RAM), a flash memory, an external memory (e.g., a secure digital (SD) card), any suitable type of memory device as would be appreciated by one of ordinary skill in the art upon viewing this disclosure, or combinations thereof.

In an embodiment, the screen 116 may be configured to present visual information to a mobile device user. For example, in such an embodiment, the screen 116 may comprise an liquid crystal display (LCD), a light emitting diode (LED) display, an organic light emitting diode (OLED) display, an active-matrix organic light emitting diode (AMOLED) display, a color super twisted nematic (CSTN) display, a thin film transistor (TFT) display, a thin film diode (TFD) display, and/or any other suitable type of display as would be appreciated by one of ordinary skill in the art upon viewing this disclosure. In an additional or alternative embodiment, the screen may further comprise a capacitive touchscreen or a resistive touchscreen.

In an embodiment, the microphone 118 and the speaker 122 may each be conventional as would be appreciated by one of ordinary skill in the art upon viewing this disclosure. For example, the microphone 118 may be configured to convert a voice signal to an electrical signal (e.g., an analog signal or a digital signal). Additionally, in an embodiment, the speaker 122 may be configured to convert an analog electrical signal into an audible signal.

In an embodiment, the plurality of I/O ports 124 may be generally configured to transmit electrical signals and/or data signals between the mobile device 100 and external hardware (e.g., an electrical outlet, a computer). For example, the I/O ports 124 may comprise a plurality of electrical contacts and may be mated with suitable interface as would be appreciated by one of ordinary skill in the art up on viewing this disclosure.

Additionally, in an embodiment, the mobile device 100 may further comprise one or more dedicated buttons and/or soft keys. For example, the one or more soft keys may be configured to allow the user to provide an input to the mobile device 100.

In an embodiment, the local oscillator 126 may be configured to interface and/or to couple to a mixer, for example, a mixer of the transmitter 114 (e.g., via electrical connection 166) and/or a mixer 126 of the receiver 112 (e.g., via electrical connection 168), as will be disclosed herein.

In an embodiment, the local oscillator 126 may be configured to produce a repetitive oscillating electronic signal (e.g., a sine wave or a square wave). For example, the local oscillator 126 may convert a direct current signal (e.g., from a power supply) to an alternating current signal. In an embodiment, the local oscillator 126 may be configured to produce an electronic signal oscillating at a frequency between 100 kilohertz (kHz) to 100 gigahertz (GHz). In the embodiment where the local oscillator 126 is configured to produce a square wave signal, the local oscillator 126 may also be configured to have a variable duty cycle. For example, the local oscillator 126 may be configured to produce a square wave signal with a 25% duty cycle. In an alternative embodiment, the local oscillator 126 may be configured to produce any other suitable signal as would be appreciated by one of ordinary skill in the art upon viewing this disclosure.

In an embodiment, the transmitter 114 may comprise a plurality of interconnected functional units (e.g., a low noise amplifier, a mixer, a filter, etc.) and may be configured to be coupled with one or more antennas 128 to produce an electrical signal and/or a RF signal. For example, the transmitter 114 may be configured to receive a data signal from the mobile device 100 and to transmit the data signal via a RF signal. In an embodiment, the transmitter 114 may be configured to produce and/or transmit a wireless signal (e.g., a RF signal) within the 700 Band, the 800 band, the 850 band, the 1400 band, the PCS band, the AWS band, the BRS/EBS band, or any other suitable frequency band as would be appreciated by one of ordinary skill in the art upon viewing this disclosure, or combinations thereof. Additionally, in an embodiment, the transmitter 114 may comprise shared functional units and/or electrical connections to other functional units of the mobile device 100, for example, an electrical connection with the receiver 112 via the electrical connection 170.

In an embodiment, the receiver 112 may comprise a plurality of interconnect functional units (e.g., a low noise amplifier, a mixer, a filter, etc.) and may be configured to be coupled with one or more antennas 128 to receive an electrical signal and/or a RF signal, as will be disclosed herein. For example, the receiver 112 may be configured to receive an electrical signal (e.g., a voltage signal or a current signal) from the antenna 128 and may be configured to convert and/or to extract a data signal from the electrical signal, as will be disclosed herein. Additionally, in an embodiment, the receiver 112 may comprise shared functional units and/or electrical connections to other functional units of the mobile device 100, for example, an electrical connection with the transmitter 114 via the electrical connection 170.

Figure 2:
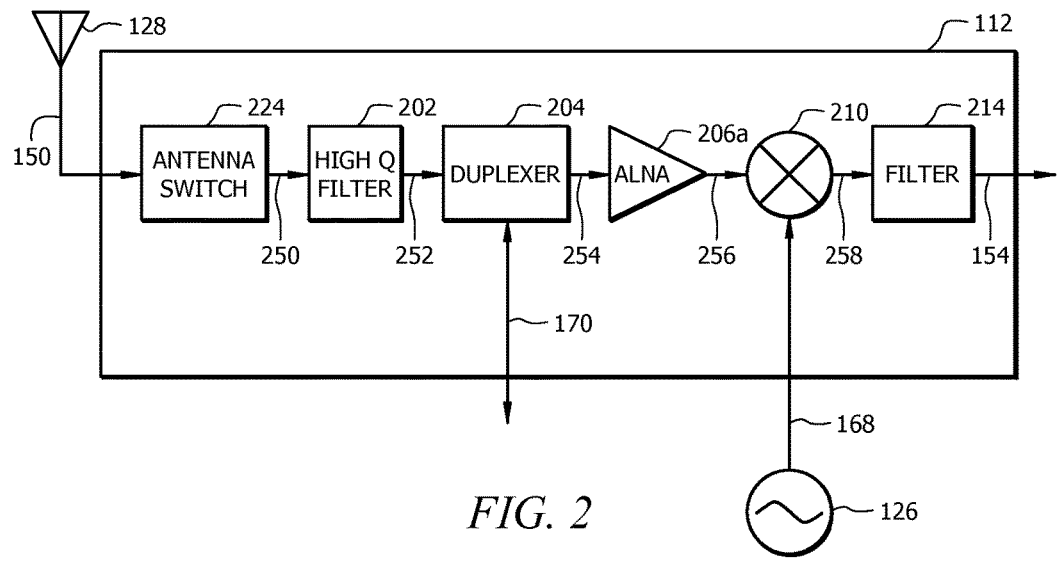
FIG. 2 is a schematic diagram of an embodiment of an electronic circuit implementation of a receiver.

In the embodiment of FIG. 2, an implementation of the receiver 112 is illustrated. It is noted that in such an embodiment the circuit level implementation is provided for illustrative purposes and that a person skilled in the relevant arts will recognize suitable alternative embodiments, configurations, and/or arrangements of such functional units which may be similarly employed. Any such functional unit embodiments may conceivably serve as elements of the disclosed implementation.

In the embodiment of FIG. 2, the receiver 112 may generally comprise an antenna switch 224, a high-Q filter 202, a duplexer 204, an ALNA 206a, a mixer 210, and a filter 214, arranged as shown in FIG. 2. Although the embodiment of FIG. 2 illustrates a receiver 112 comprising multiple distributed components (e.g., an antenna switch 224, a high-Q filter 202, a duplexer 204, an ALNA 206a, a mixer 210, and a filter 214, each of which comprises a separate, distinct component), in an alternative embodiment, a similar receiver 112 may comprise similar components in a single, unitary component. Alternatively, the functions performed by these components (e.g., the antenna switch 224, the high-Q filter 202, the duplexer 204, the ALNA 206a, the mixer 210, and the filter 214) may be distributed across any suitable number and/or configuration of like componentry, as will be appreciated by one of ordinary skill in the art with the aid of this disclosure.

In the embodiment of FIG. 2, the antenna switch 224 may be configured to receive an electrical signal from the antenna 128 (e.g., via electrical connection 150) and to communicate the electrical signal with the high-Q filter 202 (e.g., via electrical connection 250). In an embodiment, the antenna switch 224 may be controllable and/or configured to selectively provide one or more electrical channels between the antenna 128 and the high-Q filter 202. For example, the antenna switch 224 may be controlled by the logical unit 120 and may be configured to provide one or more electrical channels dependent on a frequency band of interest (e.g., the PCS band, the AWS band, the BRS band, etc.).

In the embodiment of FIG. 2, the high-Q filter 202 may be configured to receive an electrical signal from the antenna switch 224 (e.g., via electrical connection 250) and to output a band-pass filtered electrical signal to the duplexer 204 (e.g., via electrical connection 252). In an embodiment, the high-Q filter 202 may be a passive filter and may comprise one or more passive electrical components (e.g., one or more capacitors, one or more resistors, one or more inductors, etc.). In an alternative embodiment, the high-Q filter 202 may be an active filter and may comprise one or more active electrical components (e.g., one or more transistors, one or more integrated circuits). For example, the high-Q filter 202 may be a passive filter and comprise one or more capacitors and resistors and thereby form a RC filter. In an alternative embodiment, any suitable type and/or configuration may be employed as would be appreciated by one of ordinary skill in the art upon viewing this disclosure.

In an embodiment, the high-Q filter 202 may be configured to filter frequencies above a first predetermined cut-off frequency and below a second predetermined cut-off frequency. For example, the high-Q filter 202 may be configured as a band-pass filter and may be configured to limit the bandwidth of the electrical signal and/or to remove and/or substantially reduce the frequency content outside of the first predetermined cut-off frequency and the second predetermined cut-off frequency, thereby generating the band-pass filtered electrical signal.

In an embodiment, the duplexer 204 may be configured to receive a band-pass filtered electrical signal from the output of the high-Q filter 202 (e.g., via electrical connection 252) and to output the band-pass filtered electrical signal to the input of the ALNA 206a (e.g., via electrical connection 254). In an additional or alternative embodiment, the duplexer 204 may further comprise an electrical connection to the transmitter 114 in FIG. 1 (e.g., via electrical connection 170 in FIG. 1). In an embodiment, the duplexer 204 may be configured to allow bi-directional electrical communication, for example, between the receiver 112 and the antenna 128 and/or the transmitter 114 in FIG. 1.

In an embodiment, as illustrated in FIG. 2, where the ALNA 206 is electrically connected to one or more functional units (e.g., a duplexer) of the mobile device 100, an electrical signal (e.g., a band-pass filtered signal) may be received by the ALNA 206a. For example, the electrical signal may comprise a data signal received by the one or more antennas 128. In the embodiment of FIG. 2, the ALNA 206a may be configured to receive a band-pass electrical signal from the output of the duplexer 204 (e.g., via electrical connection 254) and to output an amplified electrical signal to the input of the mixer 210 (e.g., via electrical connection 256), as discussed below.

In an embodiment, the electrical signal may pass through the ALNA 206a and experience a gain (e.g., a voltage gain) and, thereby form an amplified electrical signal. For example, the electrical signal may experience a gain of about 1,000 and the voltage swing of the electrical signal may increase from about 1 millivolt (mV) to about 1 volt (V). In an alternative embodiment, the electrical signal may experience any suitable gain as established by the ALNA 206a and/or a logic unit, as disclosed herein.

In the embodiment of FIG. 2, the mixer 210 may be configured to receive the amplified electrical signal from the ALNA 206a (e.g., via electrical connections 256) and to output a mixed signal to the filter 214 (e.g., via electrical connections 258). Additionally, in an embodiment, the mixer 214 may be configured to receive an input signal from the local oscillator 126 (e.g., via electrical connections 168). For example, the mixer 210 may be coupled to a 25% duty cycle local oscillator and may be configured to receive a differential in-phase signal and a quadrature signal from the local oscillator. In an embodiment, the mixer 210 may be a passive mixer and may generally comprise one or more diodes. In an alternative embodiment, the mixer 210 may be an active mixer and may generally comprise one or more diodes and/or one or more transistors. In an alternative embodiment, any suitable type and/or configuration may be employed as would be appreciated by one of ordinary skill in the art upon viewing this disclosure.

In an embodiment, the mixer 210 may be generally configured to generate a new frequency (e.g., carrier frequency) dependent on the carrier frequency of the input signal provided via the ALNA 206a and/or a signal from the local oscillator 126. For example, the mixer 210 may be configured to perform a frequency translation and may reduce or increase the carrier frequency (e.g., down-convert or up-convert) of an input signal (e.g., the amplified electrical signal). In an embodiment, the mixer 210 may be configured to have a band-pass frequency response.

In an embodiment, the filter 214 may be configured to receive a mixed signal from the mixer 210 (e.g., via electrical connection 258) and to output a filtered electrical signal (e.g., to the logic unit 120 in FIG. 1) via electrical connection 154. In an embodiment, the filter 214 may be a passive filter and may comprise one or more passive electrical components (e.g., one or more capacitors, one or more resistors, one or more inductors, etc.). In an alternative embodiment, the filter 214 may be an active filter and may comprise one or more active electrical components (e.g., one or more transistors, one or more integrated circuits). For example, the filter 214 may be a passive filter and comprise one or more capacitors and resistors and thereby form a resistor and capacitor (RC) filter. In an alternative embodiment, any suitable type and/or configuration may be employed as would be appreciated by one of ordinary skill in the art upon viewing this disclosure.

In an embodiment, the filter 214 may be configured to filter frequencies above and/or below a predetermined cut-off frequency, for example the filter 214 may be configured as a low-pass filter, a high-pass filter, a band-pass filter, a band-stop filter, and/or any other suitable type of filter as would be appreciated by one of ordinary skill in the art upon viewing this disclosure. For example, the filter 214 may be configured as a low-pass filter and may be configured to limit the bandwidth of the mixed signal and/or to remove and/or substantially reduce the frequency content of the mixed compensated signal above a predetermined cut-off frequency, thereby generating the filtered electrical signal.

Figure 3:
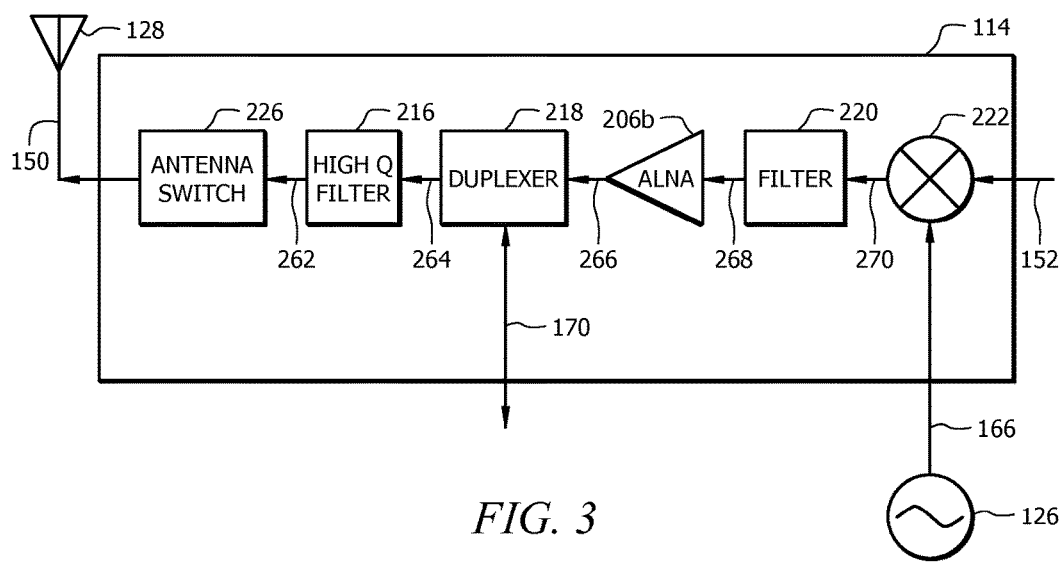
FIG. 3 is a schematic diagram of an embodiment of an electronic circuit implementation of a transmitter.

In the embodiment of FIG. 3, an implementation of the transmitter 114 is illustrated. It is noted that in such an embodiment the circuit level implementation is provided for illustrative purposes and that a person skilled in the relevant arts will recognize suitable alternative embodiments, configurations, and/or arrangements of such functional units which may be similarly employed. Any such functional unit embodiments may conceivably serve as elements of the disclosed implementation.

In the embodiment of FIG. 3, the transmitter 114 may generally comprise a mixer 222, a filter 220, an ALNA 206b, a duplexer 218, a high-Q filter 216, and an antenna switch 226. Although the embodiment of FIG. 3 illustrates a transmitter 114 comprising multiple distributed components (e.g., a mixer 222, a filter 220, an ALNA 206b, a duplexer 218, a high-Q filter 216, and an antenna switch 226, each of which comprises a separate, distinct component), in an alternative embodiment, a similar transmitter 114 may comprise similar components in a single, unitary component. Alternatively, the functions performed by these components (e.g., the mixer 222, the filter 220, the ALNA 206b, the duplexer 218, the high-Q filter 216, and the antenna switch 226) may be distributed across any suitable number and/or configuration of like componentry, as will be appreciated by one of ordinary skill in the art with the aid of this disclosure.

In an embodiment, the mixer 222 may be configured to receive a data signal (e.g., from a logic unit) via electrical connections 152 and to output a mixed signal to the filter 220 (e.g., via electrical connection 270). In an embodiment, the mixer 222 may configured similarly as previously disclosed, for example, as similarly disclosed with respect to the mixer 210 in FIG. 2. In an alternative embodiment, the mixer 222 may be of any suitable type and/or configuration as would be appreciated by one of ordinary skill in the art upon viewing this disclosure.

In an embodiment, the filter 220 may be configured to receive a mixed signal from the mixer 222 (e.g., via electrical connections 270) and to output a filtered electrical signal to the ALNA 206b (e.g., via electrical connection 268). In an embodiment, the filter 220 may configured similarly as previously disclosed, for example, as similarly disclosed with respect to the filter 214. In an alternative embodiment, the filter 220 may be of any suitable type and/or configuration as would be appreciated by one of ordinary skill in the art upon viewing this disclosure.

In an embodiment, the ALNA 206b may be configured to receive a filtered electrical signal (e.g., via electrical connections 268) and to output an amplified electrical signal to the duplexer 218 (e.g., via electrical connection 266). In an embodiment, the ALNA 206b may configured similarly as disclosed below, for example, as similarly disclosed with respect to the ALNA 206a. In an alternative embodiment, the ALNA 206b may be of any suitable type and/or configuration as would be appreciated by one of ordinary skill in the art upon viewing this disclosure.

In an embodiment, the duplexer 218 may be configured to receive an amplified electrical signal from the ALNA 206b (e.g., via electrical connections 266) and to output the amplified electrical signal to the high-Q filter 216 (e.g., via electrical connection 264). In an embodiment, the duplexer 218 may configured similarly as previously disclosed, for example, as similarly disclosed with respect to the duplexer 204. In an alternative embodiment, the duplexer 218 may be of any suitable type and/or configuration as would be appreciated by one of ordinary skill in the art upon viewing this disclosure.

In an embodiment, the high-Q filter 216 may be configured to receive an amplified electrical signal from the duplexer 218 (e.g., via electrical connections 264) and to output a band-pass filtered electrical signal to the antenna switch 226 (e.g., via electrical connection 262). In an embodiment, the high-Q filter 216 may configured similarly as previously disclosed, for example, as similarly disclosed with respect to the high-Q filter 202. In an alternative embodiment, the high-Q filter 216 may be of any suitable type and/or configuration as would be appreciated by one of ordinary skill in the art upon viewing this disclosure.

In an embodiment, the antenna switch 226 may be configured to receive a band-pass filtered electrical signal from the high-Q filter 216 (e.g., via electrical connection 262) and to output an electrical signal to the antenna 128 (e.g., via electrical connection 150). In an embodiment, the antenna switch 226 may be configured similarly as previously disclosed, for example, as similarly disclosed with respect to the antenna switch 224. In an alternative embodiment, the antenna switch 226 may be of any suitable type and/or configuration as would be appreciated by one of ordinary skill in the art upon viewing this disclosure.

In the embodiments of FIGS. 2-3, the ALNA 206 may be configured to cause an electrical signal (e.g., the band-pass electrical signal) to experience a gain, for example, a voltage gain, and thereby proportionally increase the voltage level of the electrical signal. Additionally or alternatively, in an embodiment, the ALNA 206 may be further configured to convert a voltage signal to a current signal (e.g., a transconductance amplifier) or a current signal to a voltage signal (e.g., a transimpedance amplifier) before or after applying a gain to the electrical signal. Not intending to be bound by theory, applying a gain factor of greater than one to the electrical signal may increase the voltage range over which the analog voltage signal can vary or swing, thereby improving the resolution and/or detectability of small variations of the electrical signal. For example, the electrical signal may experience a gain by a factor of about 100, by a factor of about 1,000, by a factor of about 10,000, by a factor of about 100,000, or any other suitable gain factor as would be appreciated by one of ordinary skill in the art upon viewing this disclosure. For example, a voltage signal may experience a gain of about 1,000 and the voltage swing of the voltage signal may increase from about 1 millivolt (mV) to about 1 volt (V). Additionally, in an embodiment, the ALNA 206 may be configured to have an adjustable and/or a controllable gain, for example, via a variable gain controller, as will be disclosed herein. For example, the ALNA 206 may be configured to be controlled by the logic unit 120 and may be configured to adjust its gain in response to a control signal by the logic unit 120, as will be disclosed herein. In an additional or alternative embodiment, the ALNA 206 may be configured to maintain a substantially constant input impedance, for example, via adjusting a variable impedance controller, as will be disclosed herein.

Figure 4:
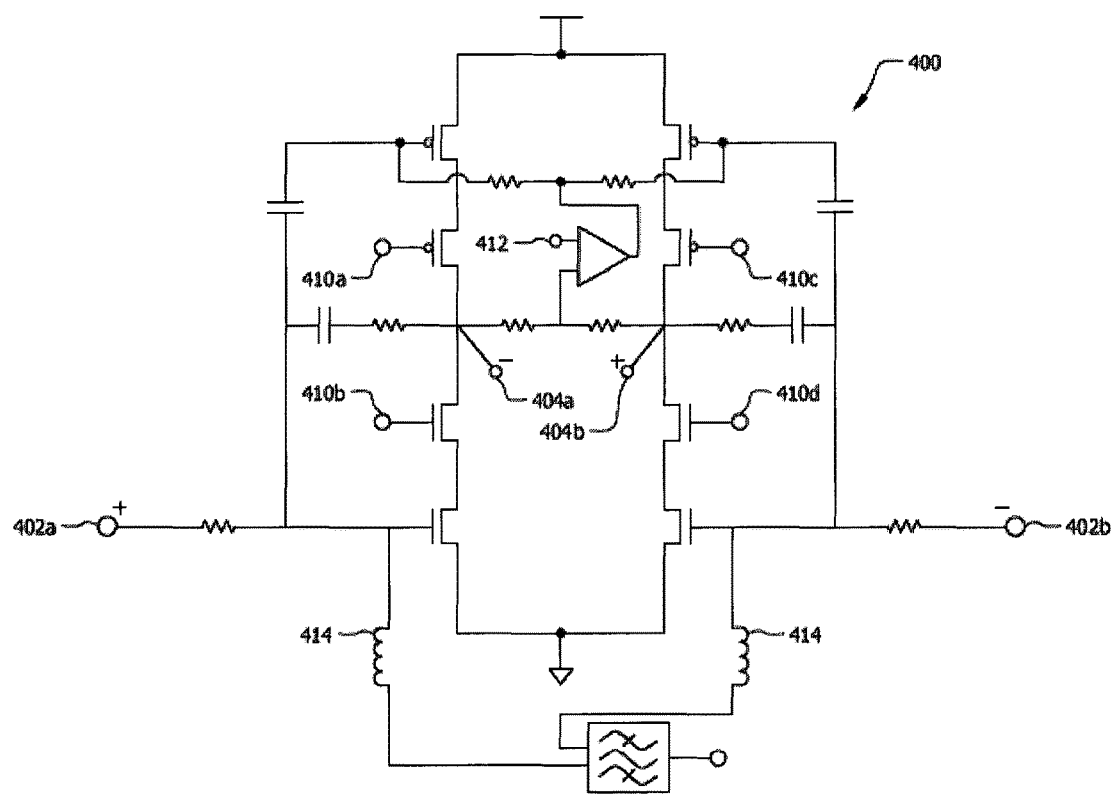
FIG. 4 is a schematic view of an embodiment of an electronic circuit implementation for a low noise amplifier.

In a conventional low noise amplifier (LNA) 400, as illustrated in FIG. 4, the LNA 400 may generally comprise a plurality of resistors, a plurality of capacitors, and a plurality of transistors and may be configured to amplify an electrical signal. In an additional or alternative embodiment, the LNA 400 may further comprise one or more inductors 414. In the embodiment of FIG. 4, the LNA 400 comprises a differential input 402 (e.g., a non-inverting input 402a and an inverting input 402b), a differential output 404 (e.g., a non-inverting output 404a and an inverting output 404b), a feedback input 412, a plurality of biasing inputs 410 (e.g., biasing inputs 410a-d) and may generally form a differential amplifier. In such an embodiment, the conventional LNA 400 may not be configured to provide an adjustable gain and/or may not be configured to maintain a substantially constant input impedance.

Figure 5:
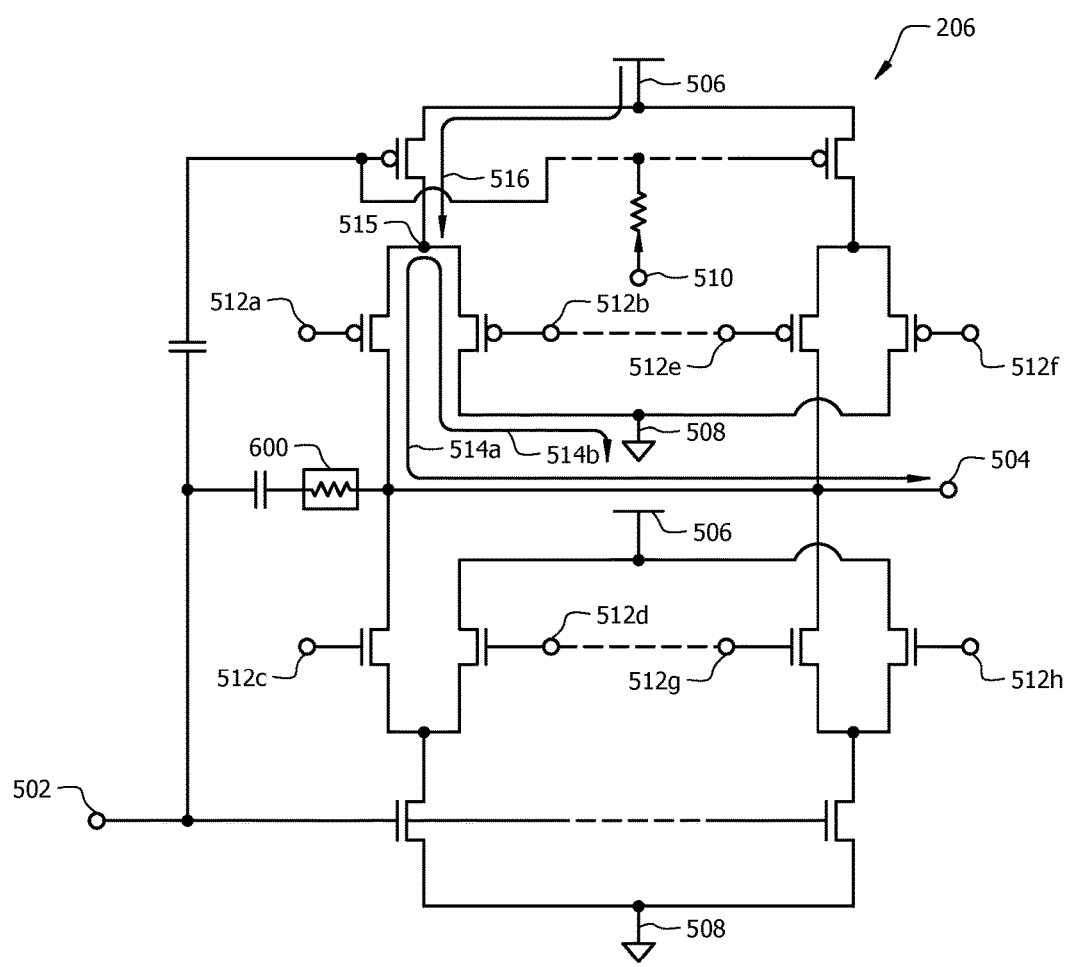
FIG. 5 is a partial schematic view of an embodiment of an electronic circuit implementation for an adjustable low noise amplifier.
Figure 6:
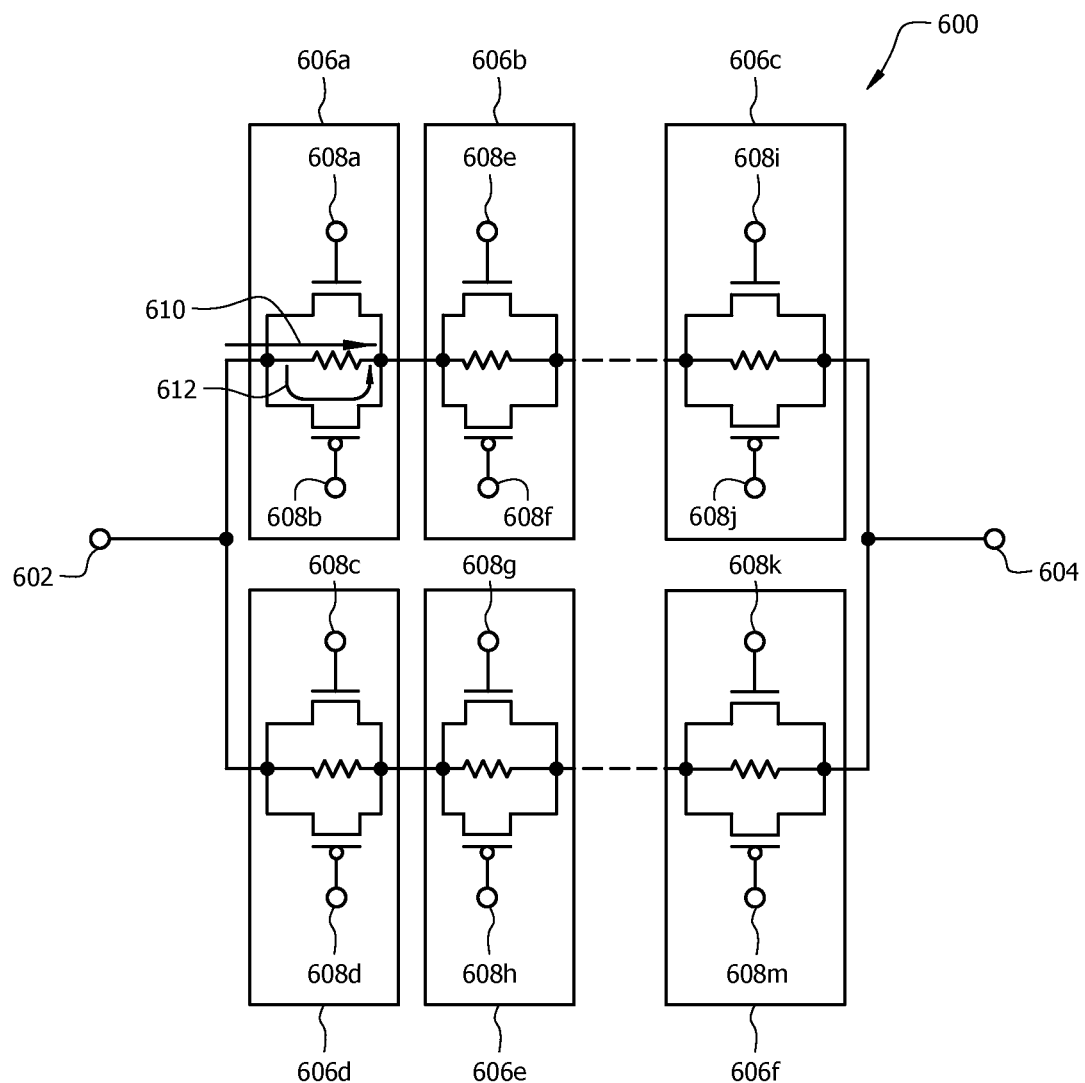
FIG. 6 is a partial schematic view of an embodiment of a variable impedance controller.

In the embodiment of FIG. 5, the ALNA 206 may generally comprise a plurality of resistors, a plurality of capacitors, a plurality of transistors, and a variable impedance controller 600. In such an embodiment, the ALNA 206 may be configured to amplify an electrical signal and to provide adjustable gain control and impedance and/or shunt resistance control (e.g., via the variable impedance controller 600), as will be disclosed herein. In the embodiment of FIG. 5, the ALNA 206 may be generally configured as a voltage amplifier (e.g., a Cascode amplifier) comprising an amplifier input 502 and one or more current flow paths coupled to an amplifier output 504, as will be disclosed herein. In an alternative embodiment, the ALNA 206 may be configured as a differential amplifier and/or any other suitable type and/or configuration of amplifier as would be appreciated by one of ordinary skill in the art upon viewing this disclosure. Additionally, in such an embodiment, the ALNA 206 may further comprise common mode feedback (e.g., via electrical connection 510) and a negative feedback connection between the amplifier input 502 and the amplifier output 504 via the variable impedance controller 600. Further, in such an embodiment, the ALNA 206 may comprise one or more of current steering inputs 512 (e.g., current steering inputs 512a-512h) and one or more current flow paths 514 (e.g., a first current flow path 514a and a second current flow path 514b), as will be disclosed herein.

In an embodiment, as illustrated in FIG. 5, the gain of the ALNA 206 may be adjusted (e.g., increased or decreased) by steering a current from the source 506 (e.g., a voltage source or a current source) towards a load (e.g., a mixer) coupled to the amplifier output 504 and/or steering at least a portion of the current from the source 506 to the ground 508 (e.g., an alternating current (AC) ground). For example, a logic unit may apply a control signal (e.g., a voltage signal or a current signal) to one or more current steering inputs 512a-512f and, thereby steer at least a portion of the current from the source 506 toward amplifier output 504. In such an embodiment, as the amount of current supplied to amplifier output 504 increases, the gain of the ALNA 206 may also increase. In an embodiment, as the amount of current supplied to amplifier output 504 decreases (e.g., via sinking a portion of the current to the ground 508), the gain of the ALNA 206 may also decrease.

In an embodiment, the gain of the ALNA 206 may be adjustable and may be controllable by adjusting (e.g., increasing or reducing) the amount of current provided by the ALNA 206 to the output (e.g., amplifier output 504) of the ALNA 206. For example, the ALNA 206 may be configured to deliver a current from a source 506 to the output of the ALNA 206 (e.g., via the first current flow path 514a and the amplifier output 504), thereby providing gain to an electrical signal. In an additional embodiment, the ALNA 206 may be configured to at least partially reduce a current being supplied from the source 506 to a load (e.g., via the first current flow path 514a and the amplifier output 504), for example, by diverting at least a portion of the current to a ground 508 (e.g., via the second current flow path 514b), thereby reducing the gain provided by the ALNA 206.

For example, in the embodiment of FIG. 5, the ALNA 206 may be configured such that a current is provided in the direction of one or more nodes (e.g., node 515) from the source 506 (e.g., a voltage source or a current source), for example, via a third current flow path 516. Not intending to be bound by theory, the current in any node (e.g., node 515) is about zero, therefore the current being supplied to the node 515 via the third current flow path 516 will exit the node 515 via the first current flow path 514a and/or the second current flow path 514b, when so configured. In an embodiment, the first current flow path 514a may be configured to selectively provide a current flow path between the node 515 and the amplifier output 504. For example, the current steering input 512a may configured to be controllable (e.g., via a voltage signal from a logic unit) and to selectively enable a current flow path, for example, applying a voltage (e.g., a forward biasing voltage) to the current steering input 512a provides a current flow path via the first current flow path 514a, thereby delivering a current to the amplifier output 504. Additionally, in an embodiment, the second current flow path 514b may be configured to selectively provide a current flow path between the node 515 and the ground 508 (e.g., an alternating current (AC) ground). In such an embodiment, the current steering input 512b may configured to be controllable (e.g., via a voltage signal from the logic unit) and to selectively enable a current flow path, for example, applying a voltage (e.g., a forward biasing voltage) to the current steering input 512b provides a current flow path via the second current flow path 514b, thereby sinking the current to the ground 508. In an additional or alternative embodiment, where the ALNA 206 comprises more than one current steering flow paths in parallel with respect to each other and may be scaled or weighted (e.g., binary weighted) to provide varying levels of current flow. For example, the ALNA 206 may be configured such that each subsequent current steering flow path provides about half of the current flow of the previous current steering flow path. In an alternative embodiment, the ALNA 206 may be configured such that each current steering flow path provides the same amount of current flow. In an alternative embodiment, the current steering flow paths may be any suitable type and/or configuration as would be appreciated by one of ordinary skill in the art upon viewing this disclosure.

In an embodiment, the variable impedance controller 600 may be controllable (e.g., via a logic unit) and may be generally configured to provide an adjustable impedance and/or shunt resistance, for example, for the purposes of adjusting the feedback resistance, the shunt resistance, the input impedance, and/or the output impedance of the ALNA 206.

In an embodiment, the variable impedance controller 600 may generally comprise one or more transistors coupled in parallel with one or more resistive elements (e.g., a resistor). For example, in the embodiment of FIG. 6, the transistors may form a transmission gate in parallel with a resistor, thereby forming a resistive module 606. In such an embodiment, the resistive module 606 may be configured to be controllable (e.g., via a logic unit) and to provide an adjustable resistance, for example, via selectively providing more than resistive current flow paths (e.g., a first resistive current flow path 610 and a second resistive current flow path 612). In an embodiment, the first resistive current flow path 610 may comprise an at least partially resistive flow path, for example, through one or more resistive elements (e.g., a resistor). Additionally, in such an embodiment, the second resistive current flow path 612 may comprise a substantially less resistive flow path with respect to the first resistive flow path 610. For example, the second resistive flow path 610 may comprise a flow path across the gates of one or more transistors, when so configured. In an alternative embodiment, a resistive module may comprise any other suitable number, type, and/or configurations of resistive current flow paths as would be appreciated by one of ordinary skill in the art upon viewing this disclosure. Additionally, in an embodiment, the resistive module 606 may be configured to select a resistive current flow path upon the application of a control signal (e.g., a voltage signal) to the gates of one or more transistors (e.g., via a logic unit). For example, in the embodiment of FIG. 6, one or more transistors of the resistive module 606 may be configured such that applying a voltage (e.g., a forward biasing voltage) to the gates (e.g., gate terminals 608a-608m) of the one or more transistors enables the second resistive current flow path 612, thereby bypassing the first resistive current flow path 610. Additionally, in such an embodiment, one or more transistors of the resistive module 606 may be configured such that in an absence of a voltage being applied to the gates (e.g., gate terminals 608a-608m) of the one or more transistors disables the second resistive current flow path 612, thereby enabling the first resistive current flow path 610.

In an embodiment, the variable impedance controller 600 may further comprise a plurality of resistive modules 606 (e.g., resistive modules 606a-606f) and may be configured to provide an adjustable impedance and/or resistance for a current flow path between an input terminal 602 and an output terminal 604 of the variable impedance controller 600. In such an embodiment, the plurality of resistive modules 606 may be coupled in series and/or parallel with respect to each other. In an embodiment, each resistive module 606 may be configured to respond individually to a control signal. In an alternative embodiment, two or more of the resistive modules 606 may be configured to respond jointly in response to a control signal.

Figure 7:
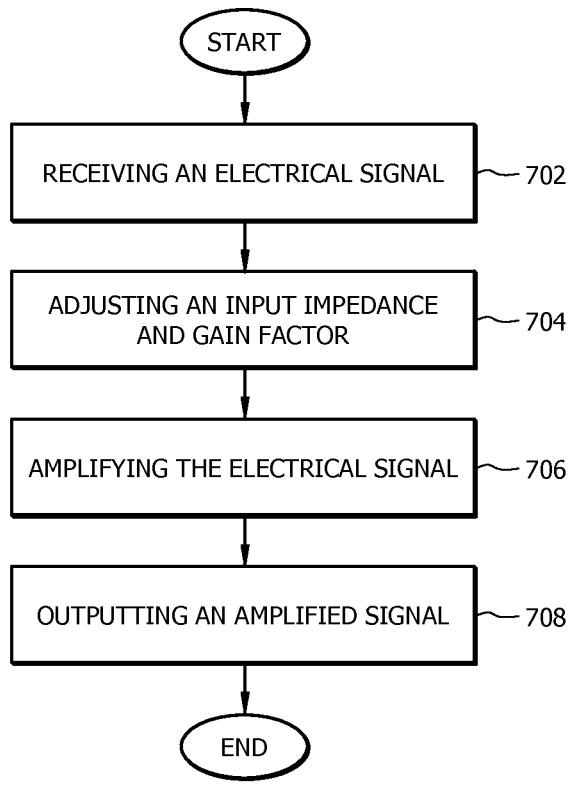
FIG. 7 is a flow chart of an embodiment of an amplification method.

In an embodiment, an amplification method utilizing the ALNA 206 and/or a system comprising an ALNA 206 is disclosed herein. In an embodiment, as illustrated in FIG. 7, an amplification method may generally comprise the steps of receiving an electrical signal 702, adjusting an input impedance and gain factor 704, amplifying the electrical signal 706, and outputting the amplified electrical signal 708. In an additional embodiment, an amplification method may further comprise receiving an electrical signal, readjusting the input impedance and/or the gain factor, amplifying the electrical signal, and outputting the amplified electrical signal.

Figure 8:
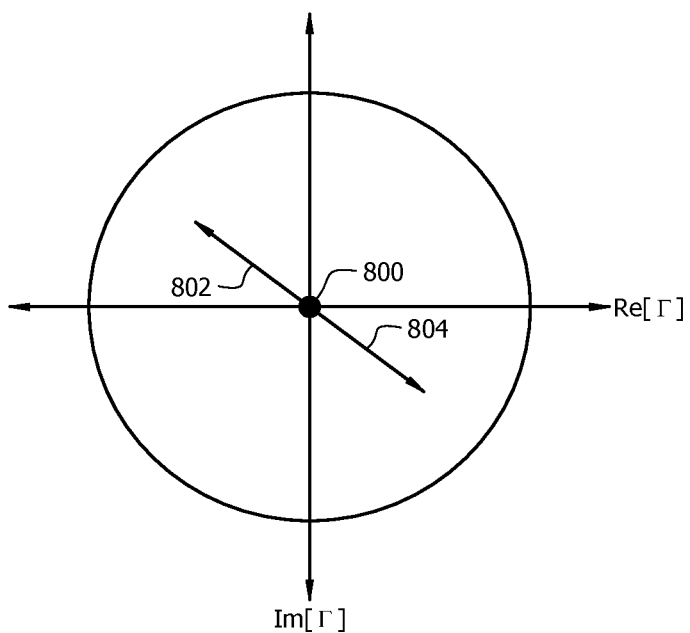
FIG. 8 is a chart of an impedance response of an adjustable low noise amplifier.

Referring to FIG. 8, an impedance response (e.g., a Smith chart) for the ALNA 206 is provided. In an embodiment, prior to adjusting the gain of the ALNA 206, the ALNA 206 may be about impedance matched and located at an impedance matched point 800. In an embodiment, adjusting the gain of the ALNA 206 may result in an impedance change 804 away from the impedance matched point 800. In an embodiment, the variable impedance controller 600 may be employed to apply a compensation impedance change 802, for example, by adjusting the impedance and/or resistance of the variable feedback controller 600 and/or the feedback resistance of the ALNA 206, as previously disclosed. For example, in the embodiment of FIG. 6, a logic unit may apply a control signal (e.g., a voltage signal or a current signal) to the gates (e.g., gate terminals 608a-608m) of one or more transistors of the resistive module 606 and, thereby may adjust the impedance and/or resistance of the variable impedance controller 600. In such an embodiment, the variable impedance controller 600 may be adjusted such that the resulting compensation impedance change 802 may offset the impedance change 804 and, thereby reconfigure the ALNA 206 to be about impedance matched and located at about the impedance matched point 800, as illustrated in FIG. 8. In an embodiment, the impedance and/or resistance of the variable impedance controller 600 and the gain of the ALNA 206 may be adjusted substantially simultaneously. For example, the variable impedance controller 600 and the gain of the ALNA 206 may be adjusted within about one second of each other. Additionally or alternatively, the variable impedance controller 600 and the gain of the ALNA 206 may be adjusted at least partially concurrently, for example, the gain of the ALNA 206 may first begin to be adjusted, then the variable impedance controller 600 may also begin to adjust, and the adjustment of the gain of the ALNA 206 may be completed prior to the completion of the variable impedance controller 600 adjustment. Alternatively, the variable impedance controller 600 may first begin to be adjusted, then the gain of the ALNA 206 may also begin to adjust, and the adjustment of the variable impedance controller 600 may be completed prior to the completion of the adjustment of the gain of the ALNA 206. Alternatively, while adjusting the gain of the ALNA 206, the variable impedance controller 600 may also begin and complete an adjustment prior to completing the gain adjustment of the ALNA 206. Alternatively, while adjusting the variable impedance controller 600, the gain of the ALNA 206 may also begin and complete an adjustment prior to completing the adjustment of the variable impedance controller 600. Additionally, in such an embodiment, the impedance response of the ALNA 206 may be substantially constant.

In an embodiment, the process of receiving an electrical signal, adjusting an input impedance and gain factor, amplifying the electrical signal, and outputting the amplified electrical signal may be repeated. For example, in a manner similar to that disclosed herein, the gain and/or the impedance (e.g., the variable impedance controller 600) of the ALNA 206 may be adjusted and, thereby amplify an electrical signal to generate an amplified electrical signal while maintaining the input impedance of the ALNA 206 to be substantially constant.

In an embodiment, an ALNA 206, a system comprising an ALNA 206, and/or an amplification method employing a system and/or an ALNA 206, as disclosed herein or in some portion thereof, may be advantageously employed during mobile device operations. As will be appreciated by one of ordinary skill in the art, conventional methods of amplifying an electrical signal may not have the capabilities to provide an adjustable gain and/or to maintain a substantially constant input impedance. In an embodiment, the ALNA 206 enables an adjustable gain while substantially simultaneously adjusting an input impedance, as previously disclosed. For example, the performance of the receiver 112, the transmitter 114, and/or the mobile device 100 can be improved and provide a substantially stable frequency response. Therefore, the methods disclosed herein provide a means by which the performance of the receiver 112, the transmitter 114, and/or the mobile device 100 can be improved.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. The use of the term about means±10% of the subsequent number, unless otherwise stated. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A mobile device comprising:
   an antenna;
   a receiver coupled to the antenna; and
   a transmitter coupled to the antenna,
   wherein the receiver, the transmitter, or both comprise a low noise amplifier comprising an adjustable gain and a variable impedance controller, the variable impedance controller is configured to adjust an input impedance of the low noise amplifier by selectively providing more than one resistive flow path, and the low noise amplifier is configured to sink current and to adjust a shunt resistance simultaneously using a plurality of current flow paths, wherein a first current flow path extends between a source node and ground and a second current flow path extends between the source node and a load without connecting to the ground.

2. The mobile device of claim 1, wherein the variable impedance controller comprises one or more transistors and one or more resistors in parallel with the one or more transistors.

3. The mobile device of claim 2, wherein the variable impedance controller further comprises two or more of the transistors in parallel with the resistors in series with each other.

4. The mobile device of claim 2, wherein the variable impedance controller further comprises two or more of the transistors in parallel with the resistors in parallel with each other.

5. The mobile device of claim 4, wherein the low noise amplifier comprises two or more current flow paths in parallel, and wherein the current flow paths in parallel comprise a connection to the ground.

6. The mobile device of claim 1, wherein simultaneously is within about one second of each other.

7. The mobile device of claim 1, wherein simultaneously is at least partially concurrent.

8. A method comprising:
   receiving an electrical signal;
   simultaneously adjusting an input impedance and a gain factor, wherein the input impedance is adjusted by selectively providing more than one resistive flow path, wherein the gain factor is adjusted by sinking current using a plurality of current flow paths, wherein a first current flow path extends between a source node and ground and a second current flow path extends between the source node and a load without connecting to the ground;
   amplifying the electrical signal, thereby producing an amplified signal; and
   outputting the amplified signal.

9. The method of claim 8, wherein the input impedance is adjusted by adjusting a shunt resistance.

10. The method of claim 9, wherein the shunt resistance is adjusted by configuring a variable impendence controller.

11. The method of claim 10, wherein the input impedance is maintained constant.

12. The method of claim 11, wherein the gain factor is adjusted sinking at least a portion of the current to the ground.

13. The method of claim 11, wherein at least a portion of the current is diverted away from the load.

14. The method of claim 8, wherein substantially simultaneously is within about one second of each other.

15. The method of claim 8, wherein simultaneously is at least partially concurrent.

16. A mobile device comprising:
   an antenna;
   a receiver coupled to the antenna; and
   a transmitter coupled to the antenna,
   wherein the receiver and the transmitter each comprise a low noise amplifier comprising an adjustable gain and a variable impedance controller, the variable impedance controller is configured to adjust an input impedance of the low noise amplifier by selectively providing more than one resistive flow path, and the low noise amplifier is configured to sink current and to adjust a shunt resistance simultaneously using a plurality of current flow paths, wherein a first current flow path extends between a source node and ground and a second current flow path extends between the source node and a load without connecting to the ground, and
   wherein a first resistive flow path extends between the source node and the ground and a second resistive flow path extends between the source node and a load without connecting to the ground.

17. The mobile device of claim 16, wherein the variable impedance controller comprises a plurality of transistors in parallel with a plurality of resistors.

18. The mobile device of claim 16, wherein simultaneously is within one second of each other.

19. The mobile device of claim 16, wherein at least a portion of the current is sunk to the ground.

* * * * *